(12) United States Patent
Noguchi

(10) Patent No.: US 12,480,762 B2
(45) Date of Patent: Nov. 25, 2025

(54) MOUNTING DEVICE, AND METHOD FOR DETECTING DEGREE OF PARALLELISM OF MOUNTING DEVICE

(71) Applicant: Yamaha Robotics Co., Ltd., Tokyo (JP)

(72) Inventor: Yuichiro Noguchi, Tokyo (JP)

(73) Assignee: Yamaha Robotics Co., Ltd., Tokyo (JP)

( * ) Notice: Subject to any disclaimer, the term of this patent is extended or adjusted under 35 U.S.C. 154(b) by 202 days.

(21) Appl. No.: 18/278,012

(22) PCT Filed: Feb. 22, 2021

(86) PCT No.: PCT/JP2021/006551
§ 371 (c)(1),
(2) Date: Aug. 21, 2023

(87) PCT Pub. No.: WO2022/176183
PCT Pub. Date: Aug. 25, 2022

(65) Prior Publication Data
US 2024/0318958 A1 Sep. 26, 2024

(51) Int. Cl.
*H01L 21/67* (2006.01)
*G01B 21/08* (2006.01)
*G01B 21/24* (2006.01)

(52) U.S. Cl.
CPC ............. *G01B 21/24* (2013.01); *G01B 21/08* (2013.01)

(58) Field of Classification Search
CPC . H01L 21/68; H01L 21/67259; H01L 21/681; H01L 21/67242; H01L 21/67276;
(Continued)

(56) References Cited

U.S. PATENT DOCUMENTS 8,454,771 B2 6/2013 Horikoshi
9,299,620 B2 3/2016 Horikoshi
(Continued)

FOREIGN PATENT DOCUMENTS

JP 09232798 A * 9/1997
JP H09232798 9/1997
(Continued)

OTHER PUBLICATIONS

"Office Action of Korea Counterpart Application", issued on Nov. 27, 2024, with English translation thereof, pp. 1-19.
(Continued)

*Primary Examiner* — Robert R Raevis
(74) *Attorney, Agent, or Firm* — JCIPRNET

(57) ABSTRACT

In this method for detecting a degree of parallelism of a mounting device: a triangular pin is arranged at a point A on a placement surface of a stage; a mounting head is lowered, and a height of the mounting head when a holding surface comes into contact with a tip end of the triangular pin is detected using an encoder, after which the triangular pin is moved to a point B and the mounting head is lowered; the height of the mounting head when the holding surface comes into contact with the tip end of the triangular pin is detected by the encoder; and the degree of parallelism between the placement surface of the stage and the holding surface of the mounting head is calculated on the basis of the detected heights at point A and point B.

7 Claims, 7 Drawing Sheets

(58) Field of Classification Search
CPC ... H01L 22/14; H01L 22/30; H01L 21/67288; B25J 9/1692; B25J 19/0095; B25J 19/02; G01B 11/14; G06T 7/80; G06T 2207/30148; G06T 7/0004; G06T 7/60
USPC ...... 73/865.8, 865.9; 33/712, 783, 534, 535; 438/11, 14, 18; 100/99, 258 A
See application file for complete search history.

(56) References Cited

U.S. PATENT DOCUMENTS

| | | | |
|---|---|---|---|
| 10,492,351 | B2 | 11/2019 | Sato et al. |
| 2005/0061852 | A1 | 3/2005 | Behler |

FOREIGN PATENT DOCUMENTS

| | | | | |
|---|---|---|---|---|
| JP | 2014017328 | | 1/2014 | |
| JP | WO2016024364 A1 * | | 6/2017 | ......... H05K 13/0812 |
| KR | 20050029689 | | 3/2005 | |
| TW | 200924102 | | 6/2009 | |
| TW | I602479 | | 10/2017 | |
| WO | 2016024364 | | 2/2016 | |
| WO | WO-2020246214 A1 * | | 12/2020 | ............. B24B 55/12 |

OTHER PUBLICATIONS

"Office Action of Korea Counterpart Application", issued on Mar. 21, 2024, with English translation thereof, p. 1-p. 14.
"First Office Action Notification of China Counterpart Application", issued on Feb. 13, 2025, with English translation thereof, pp. 1-17.
"Second Office Action of China Counterpart Application", issued on May 31, 2025, with English translation thereof, pp. 1-17.
"International Search Report (Form PCT/ISA/210) of PCT/JP2021/006551", mailed on Apr. 13, 2021, with English translation thereof, pp. 1-4.
"Office Action of Taiwan Counterpart Application", issued on Sep. 30, 2022, with partial English translation thereof, pp. 1-17.
"Office Action of Taiwan Counterpart Application", issued on Feb. 1, 2023, with partial English translation thereof, pp. 1-12.
"Office Action of Taiwan Counterpart Application", issued on May 16, 2023, with partial English translation thereof, pp. 1-11.

* cited by examiner

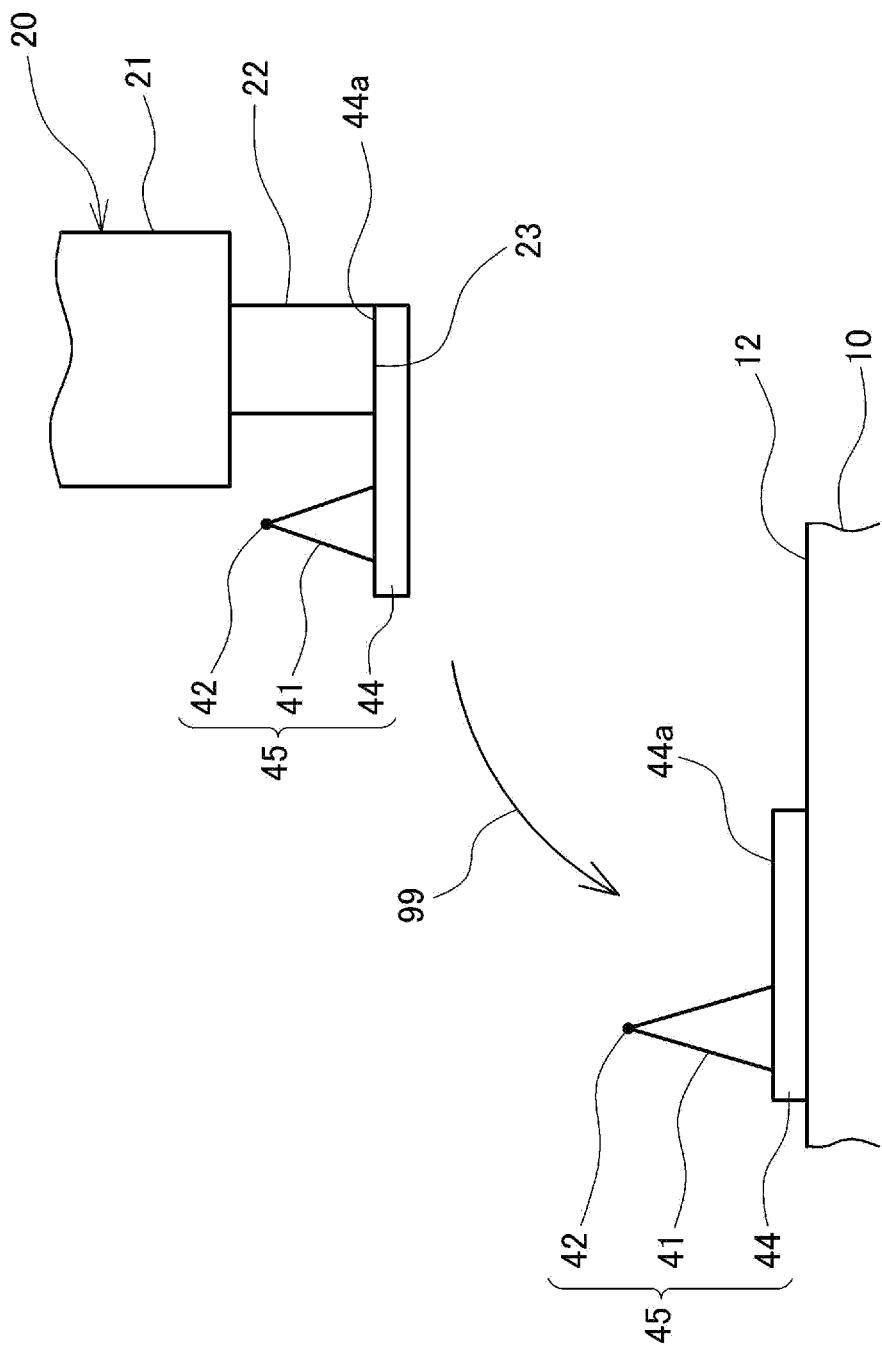

MOUNTING DEVICE, AND METHOD FOR DETECTING DEGREE OF PARALLELISM OF MOUNTING DEVICE

CROSS-REFERENCE TO RELATED APPLICATION

This application is a 371 application of the International PCT application serial no. PCT/JP2021/006551, filed on Feb. 22, 2021. The entirety of the above-mentioned patent application is hereby incorporated by reference herein and made a part of this specification.

TECHNICAL FIELD

The invention relates to a configuration of a mounting device for mounting a semiconductor chip on a mounted body of a substrate, etc., and a method for detecting a degree of parallelism between a placement surface of a stage of a mounting device and a holding surface of a mounting head.

RELATED ART

A mounting device which drives a mounting head in a state in which a semiconductor chip is sucked and held on a holding surface of a tip end of the mounting head and mounts the semiconductor chip on a substrate sucked and held on a placement surface of a stage is widely known. In such mounting device, in order to favorably bond the semiconductor chip onto a surface of the substrate, it is required that the placement surface of the stage and the holding surface of the mounting head holding the semiconductor chip be accurately parallel to each other.

Therefore, a method for detecting the inclination between a sucking surface of a bonding tool installed to the mounting head and the placement surface of the stage is proposed. For example, Patent Document 1 proposes a method in which a contact pin is embedded in the placement surface of the stage, and an operation of moving the stage while bringing the sucking surface into contact with the upper end of the embedded pin and obtaining a height at this time is performed at multiple positions on the sucking surface, thereby obtaining the inclination between the placement surface of the stage and the sucking surface of the bonding tool.

CITATION LIST

Patent Literature

[Patent Document 1] Japanese Laid-open No. 2014-17328

SUMMARY OF INVENTION

Technical Problem

However, in the method of Patent Document 1, only the degree of parallelism between the movement direction of the stage and the sucking surface of the bonding tool is measured, and it is difficult to correctly detect the degree of parallelism between the placement surface of the stage and the holding surface of the mounting head.

Therefore, an objective of the invention is to accurately detect the actual degree of parallelism between the placement surface of the stage and the holding surface of the mounting head.

Solution to Problem

A method for detecting a degree of parallelism of a mounting device mounting a semiconductor chip to a mounted body according to the invention includes: a stage, including a placement surface on which the mounted body is placed; a mounting head, sucking and holding the semiconductor chip by using a holding surface facing the placement surface of the stage, and moving in Z direction that moves toward or away from the placement surface of the stage; and an encoder, detecting a height of the mounting head; a height detection step of, at a plurality of measurement positions, repetitively executing an operation of disposing a measurement tool of a predetermined height at one of the measurement positions on the placement surface of the stage, lowering the mounting head and detecting a height of the mounting head by using the encoder at a time when the holding surface contacts an upper end of the measurement tool and then moving the measurement tool to another one of the measurement positions on the placement surface, and at the measurement positions, detecting a plurality of heights of the mounting head at the time when the holding surface contacts the upper end of the measurement tool; a degree of parallelism calculation step of calculating a degree of parallelism between the placement surface of the stage and the holding surface of the mounting head based on the heights that are detected.

Accordingly, the actual degree of parallelism between the placement surface of the stage and the holding surface of the mounting head can be correctly detected.

In the method for detecting the degree of parallelism according to the invention, it may also be that the measurement positions are within a range facing the holding surface within the placement surface, and in the degree of parallelism calculation step, a difference of the heights at the measurement positions is calculated, and an absolute value of the difference is calculated as the degree of parallelism.

Accordingly, the actual degree of parallelism between the placement surface of the stage and the holding surface of the mounting head can be correctly detected by using a simple method.

In the method for detecting the degree of parallelism according to the invention, it may also be that the measurement positions include a pair of positions arranged in X direction and another pair of positions arranged in Y direction, and in the degree of parallelism calculation step, an X direction degree of parallelism is calculated as an absolute value of a difference between a pair of heights at the pair of positions arranged in X direction, a Y direction degree of parallelism is calculated as an absolute value of a difference between another pair of heights at the another pair of positions arranged in Y direction, and the degree of parallelism is calculated as a sum of the X direction degree of parallelism and the Y direction degree of parallelism.

In the method for detecting the degree of parallelism according to the invention, it may also be that the measurement positions are located at four positions arranged in a lattice shape in X direction and Y direction, and in the degree of parallelism calculation step, a first set X difference between a pair of heights at a pair of positions of a first set arranged in X direction and a second set X difference between a pair of heights at a pair of positions of a second set arranged in X direction are calculated, an average between the first set X difference and the second set X difference is calculated as an X difference, an absolute value of the X difference is calculated as an X direction degree of parallelism, a third set Y difference between a pair of heights at a pair of positions of a third set arranged in Y direction and a fourth set Y difference between a pair of heights at a pair of positions of a fourth set arranged in Y direction are calculated, an average between the third set Y difference and the fourth set Y difference is calculated as a Y difference, an absolute value of the Y difference is calculated as a Y direction degree of parallelism, the degree of parallelism is calculated as a sum of the X direction degree of parallelism and the Y direction degree of parallelism. At this time, the holding surface may be a square surface, and the measurement positions may correspond to four corners of the holding surface.

Accordingly, the degree of parallelism taking into consideration the inclination in X direction and the inclination in Y direction can be detected.

A mounting device mounting a semiconductor chip to a mounted body according to the invention includes: a stage, including a placement surface on which the mounted body is placed; a mounting head, sucking and holding the semiconductor chip by using a holding surface facing the placement surface of the stage, and moving in Z direction that moves toward or away from the placement surface of the stage; and an encoder, detecting a height of the mounting head; a measurement tool, having a predetermined height and disposed on the placement surface of the stage; an actuator, moving the measurement tool within the placement surface; and a controller, adjusting movement of the mounting head and movement of the measurement tool, and calculating a degree of parallelism between the placement surface of the stage and the holding surface of the mounting head based on a height of the mounting head detected by using the encoder. The controller is configured to: at a plurality of measurement positions, repetitively execute an operation of disposing the measurement tool at one of the measurement positions on the placement surface of the stage by using the actuator, lower the mounting head and detect a height of the mounting head by using the encoder at a time when the holding surface contacts an upper end of the measurement tool and then moving the measurement tool to another one of the measurement positions on the placement surface by using the actuator, and at the measurement positions, detect a plurality of heights of the mounting head at the time when the holding surface contacts the upper end of the measurement tool, and calculate the degree of parallelism between the placement surface of the stage and the holding surface of the mounting head based on the heights that are detected.

In the mounting device according to the invention, it may also be that the measurement positions are within a range facing the holding surface within the placement surface, and the controller is configured to calculate a difference of the heights at the measurement positions, and calculate an absolute value of the difference as the degree of parallelism.

Effects of Invention

According to the invention, the actual degree of parallelism between the placement surface of the stage and the holding surface of the mounting head can be accurately detected.

BRIEF DESCRIPTION OF DRAWINGS

FIG. 7 is a view illustrating a process for setting a triangular pin at a predetermined position by using a triangular pin assembly 45 fixing a bottom surface of the triangular pin to a base.

DESCRIPTION OF EMBODIMENTS

Figure 1:
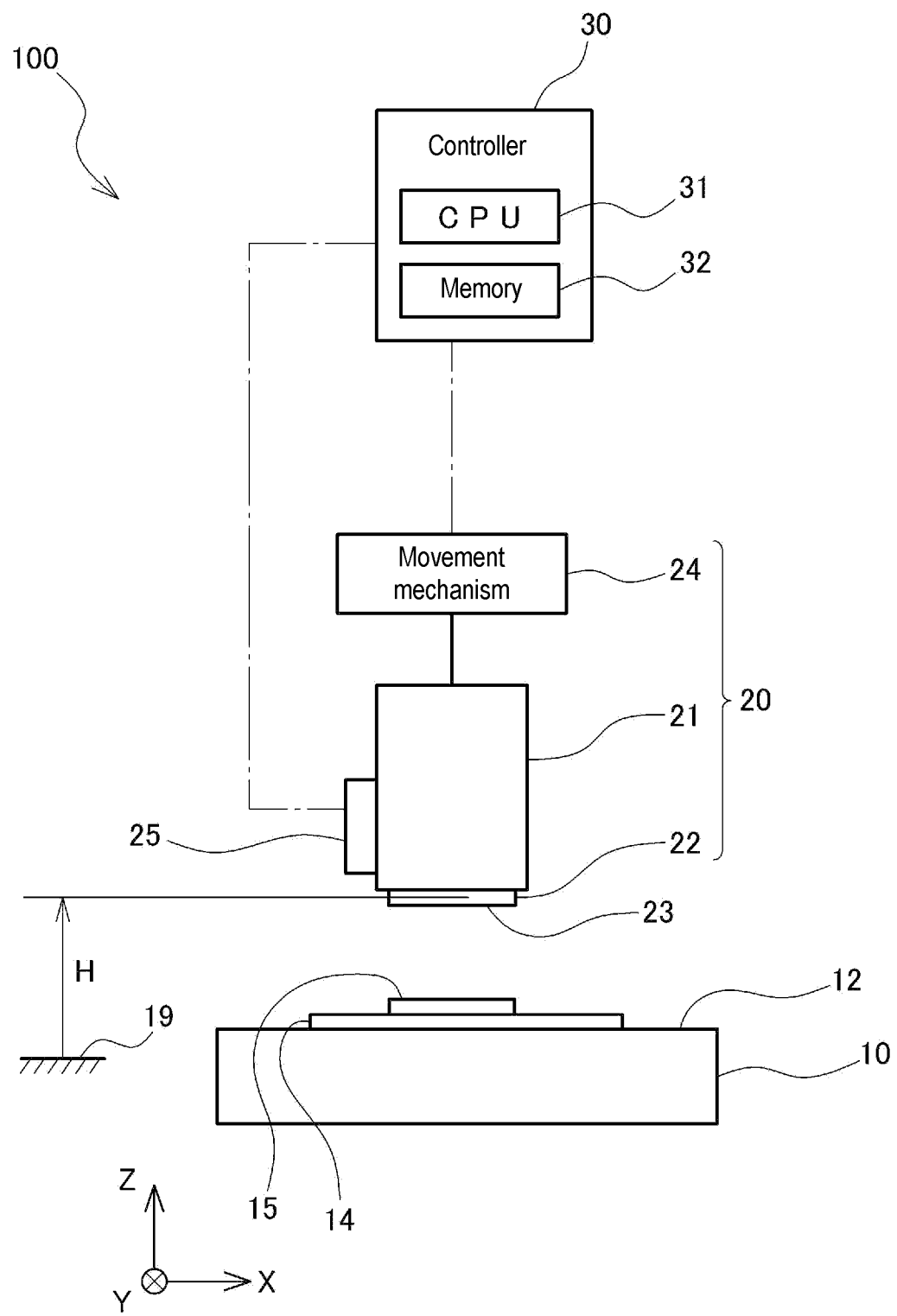
FIG. 1 is a view illustrating a configuration of a mounting device used for executing a method for detecting a degree of parallelism according to an embodiment.

In the following, a method for detecting a degree of parallelism between a placement surface 12 of a stage 10 and a holding surface 23 of a mounting head 20 by using a mounting device 100 is described with reference to the drawings.

Firstly, the mounting device 100 is described. As shown in FIG. 1, the mounting device 100 includes the stage 10, the mounting head 20, an encoder 25, and a controller 30. The mounting device 100 is a device mounting a semiconductor chip 15 to a substrate 14. In the following description, a direction along the placement surface 12 of the stage 10 is set as X direction, a direction along the placement surface 12 and orthogonal to X direction is set as Y direction, and a direction which moves toward or away from the placement surface 12 is set as Z direction or upper-lower direction.

The stage 10 includes the placement surface 12 in which the substrate 14 as a mounted body is placed on an upper side surface. In the case where the semiconductor chip 15 is mounted on the substrate 14, the substrate 14 is vacuum-sucked on the placement surface 12, and is heated by a heater (not shown) installed inside.

The mounting head 20 is formed by a main body 21, a mounting tool 22, and a movement mechanism 24. The main body 21 is movable in X, Y, and Z directions by the movement mechanism 24. The configuration of the movement mechanism 24 is not particularly limited, as long as it is configured to be able to move the main body 21 in X, Y, Z directions. However, as an example, the movement mechanism 24 may also be formed by a gantry frame movable in Y direction, a slider installed to the gantry frame and moving in X direction, and a Z direction motor installed to the slider and moving the main body 21 in Z direction. The mounting tool 22 is installed to the lower end of the main body 21, and sucks and holds the semiconductor chip 15 by using the holding surface 23 facing the placement surface of the stage 10. The mounting head 20 heats the semiconductor device 15 sucked and held on the holding surface 23 of the mounting tool 22 by using a heater not shown herein and presses the semiconductor chip 15 to the substrate 14, thereby mounting the semiconductor chip to the substrate 14.

The encoder 25 detects the height of the mounting head 20. Although the encoder 25 can be set to detect the heights of various portions of the mounting head 20, in the mounting device 100 of the embodiment, the encoder 25 is described as detecting a height H of the mounting tool 22 from a reference surface 19. The reference surface 19 is a virtual surface set in the mounting device 100.

The controller 30 is a computer internally including a CPU 31 which is a processor performing information processing and a memory 32 storing a program and data for executing the program. The movement mechanism 24 is connected to the controller 30 to move the main body 21 of the mounting head 20 in X, Y, Z directions according to a command of the controller 30. In addition, the encoder 25 inputs the detected height H to the controller 30. The CPU 31 of the controller 30 processes the data of the height H input from the encoder 25, and calculates the degree of parallelism between the placement surface 12 of the stage 10 and the holding surface 23 of the mounting head 20.

Figure 2:
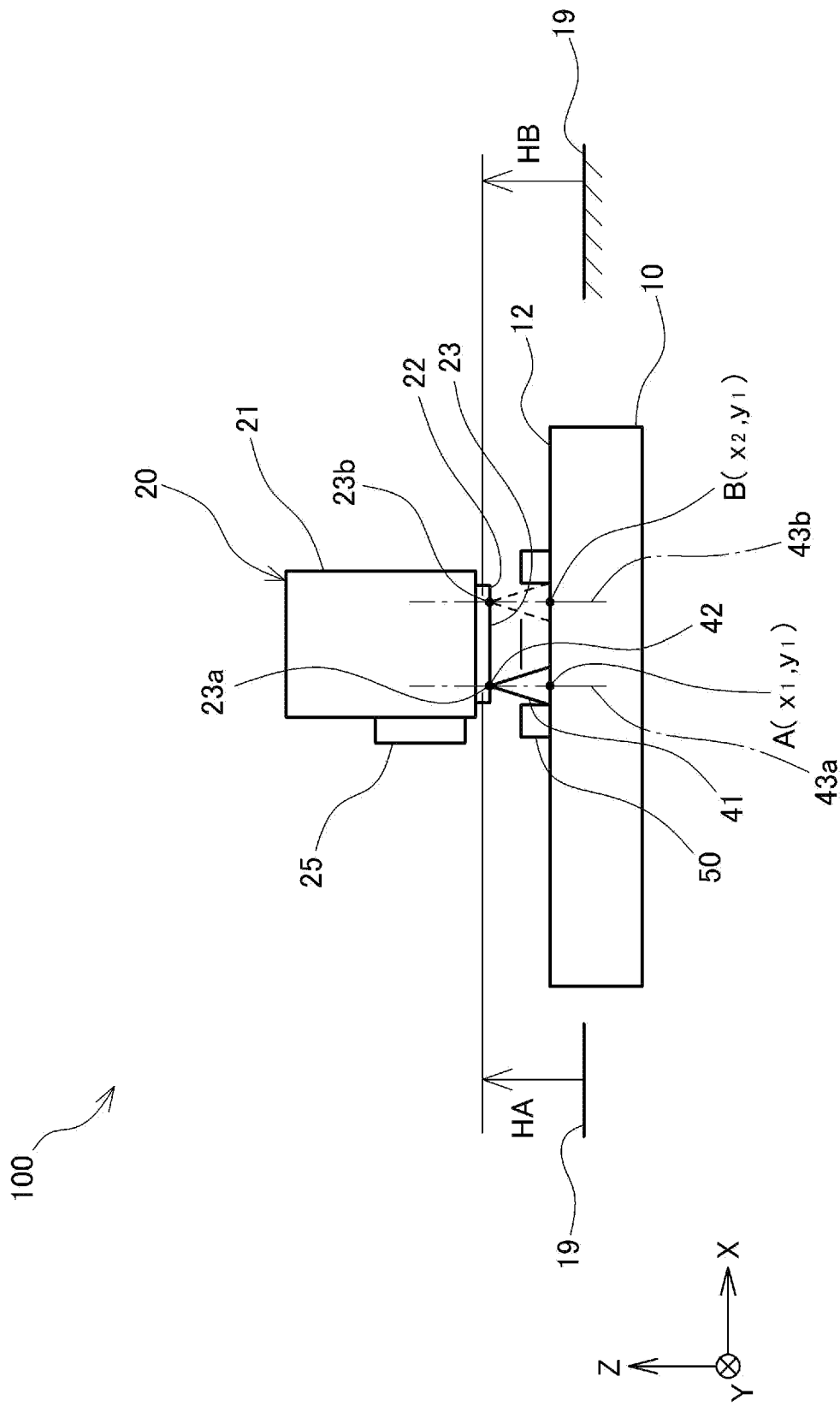
FIG. 2 is a view illustrating a process for detecting a height at a time of detecting a degree of parallelism between a placement surface of a stage and a holding surface of a mounting head in the mounting device shown in FIG. 1.
Figure 3:
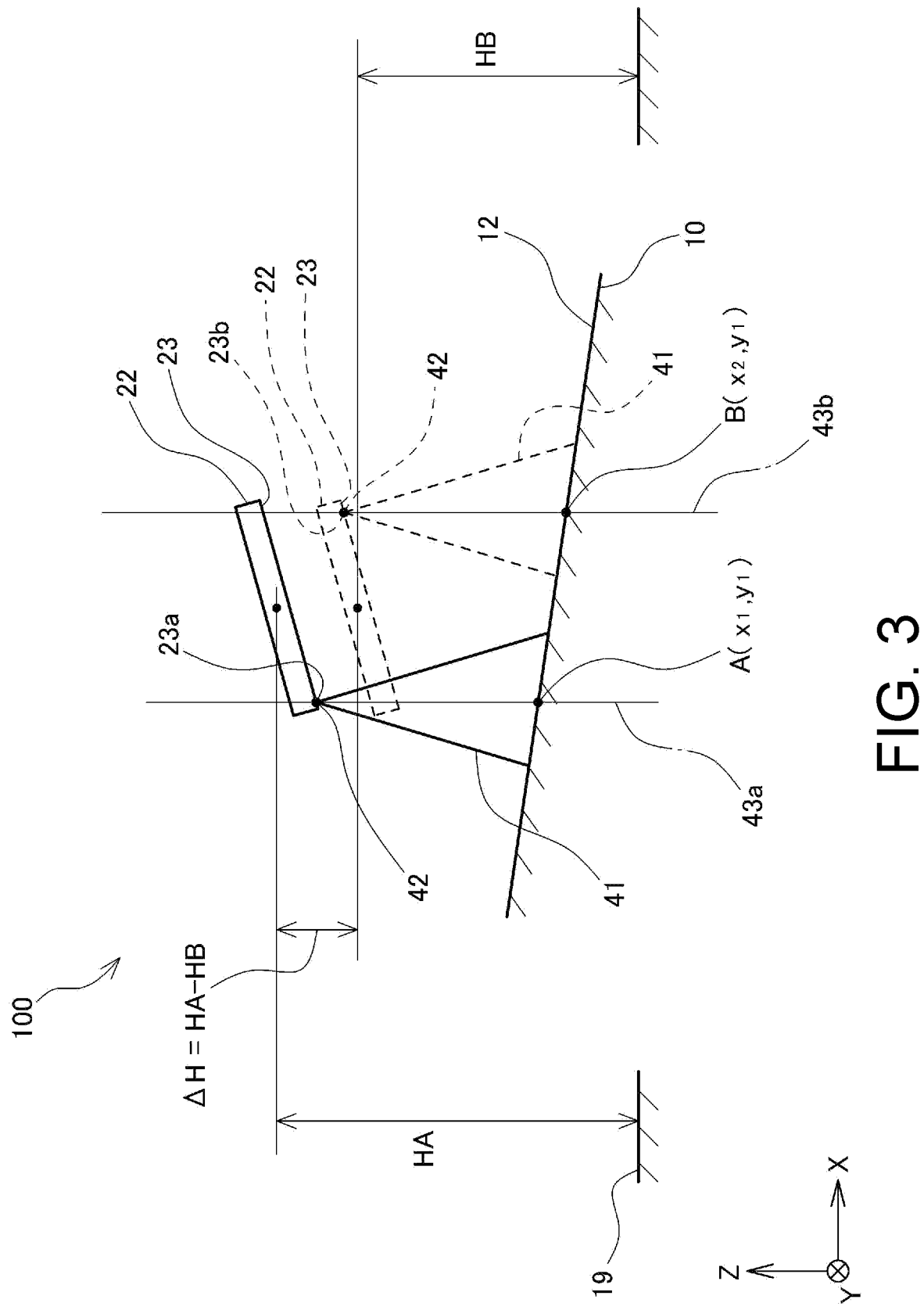
FIG. 3 is an enlarged schematic view illustrating the process for detecting the height shown in FIG. 2.

In the following, a method for detecting a degree of parallelism between the placement surface 12 of the stage 10 and the holding surface 23 of the mounting head 20 in the mounting device 100 is described with reference to FIGS. 2 and 3. In the following description, the case where the heights at two points, i.e., points A and B, on the placement surface 12 with different coordinate positions in X direction are detected to detect the degree of parallelism between the placement surface 12 and the holding surface 23 is described. Here, the XY coordinates of the point A are (x1, y1), and the XY coordinates of the point B are (x2, y1). In addition, the distance (x1−x2) between the point A and the point B in X direction is shorter than the width of the mounting tool 22 in X direction. Accordingly, the point A and the point B are located within a range facing the holding surface 23 of the mounting tool 22 within the placement surface 12. In addition, the XY coordinates (x1, y1) of the point A and the XY coordinates (x2, y1) of the point B are two measurement positions. In FIGS. 2 and 3, dot-chain lines 43a, 43b are respectively lines passing through the points A and B and extending along Z direction.

Firstly, a process for detecting height is described. As shown in FIG. 2, a triangular pin 41 is disposed so that the center of the triangular pin 41 as a measurement tool is located at the point A on the placement surface 12 of the stage 10. Regarding the arrangement of the triangular pin 41, it may be that a positioning member 50 which defines the position of the triangular pin 41 is vacuum-sucked to the placement surface 12, and the side surface of the triangular pin 41 is pressed against the positioning member 50.

The triangular pin 41 is a cone-shaped body with a tip end 42 that is pointy. As shown in FIG. 2, when the bottom surface of the triangular pin 41 is placed on the placement surface 12, the pointy tip end 42 serves as the upper end of the measurement tool. Although the measurement tool is described as a cone-shaped body with the pointy tip end 42 in the embodiment, the shape may be irrelevant as long as the tip end 42 is pointy.

The CPU 31 of the controller 30 moves, by using the movement mechanism 24, the mounting head 20 in XY direction at a movement height at which the height of the holding surface 23 of the mounting tool 22 is higher than the tip end 42 of the triangular pin 41, and sets the position of the mounting head 20 in XY direction so that the end part of the mounting tool 22 on the negative side in X direction becomes the XY coordinates (x1, y1) of the point A.

Then, as indicated by a solid line in FIG. 3, the CPU 31 of the controller 30 lowers the mounting head 20 by using the movement mechanism 24, and making the holding surface 23 of the mounting tool 22 abut against the tip end 42 of the triangular pin 41. At this time, the tip end 42 of the triangular pin 41 contacts a point 23a of the end part of the holding surface 23 on the negative side in X direction, which is an intersection point between the dot-chain line 43a extending in Z direction and passing through the point A and the holding surface 23. Then, at the time when the tip end 42 of the triangular pin 41 contacts the holding surface 23, the CPU 31 of the controller 30 obtains the height of the mounting tool 22 that is detected by the encoder 25 as a height HA of the point A.

The detection that the holding surface 23 abuts against the tip end 42 of the triangular pin 41 can be carried out by various methods. For example, the contact may be detected in the case where a predetermined difference between a height command value output by the CPU 31 to the movement mechanism 24 and the height H detected by the encoder 25 is generated; or the contact may be detected when the detected height input from the encoder 25 does not change even if the CPU 31 outputs a command for lowering the mounting head 20 to the movement mechanism 24. In addition, the main body 21 may also be provided in advance with a load sensor (not shown) which detects a load in Z direction applied to the mounting tool 22, and the abutting is detected when the load in Z direction as detected by the load sensor is equal to or greater than a predetermined threshold.

In addition, after raising the mounting head 20, the CPU 31 of the controller 30 arranges the mounting head 20 to wait at the raised position. In addition, as indicated by the broken lines in FIGS. 2 and 3, the triangular pin 41 is moved in X direction, so that the center position of the triangular pin 41 is located at the position of the point B in the placement surface 12. Then, as indicated by a broken line in FIG. 3, the mounting head 20 is lowered by the movement mechanism 24, and the holding surface 23 of the mounting head 20 abuts against the tip end 42 of the triangular pin 41. At this time, the tip end 42 of the triangular pin 41 contacts a point 23b of the end part of the holding surface 23 on the positive side in X direction, which is an intersection point between the dot-chain line 43b extending in Z direction and passing through the point B and the holding surface 23. Then, at the time when the tip end 42 of the triangular pin 41 contacts the holding surface 23, the CPU 31 of the controller 30 obtains the height of the mounting tool 22 that is detected by the encoder 25 as a height HB of the point B.

After the height HA and the height HB are obtained, the CPU 31 of the controller 30 ends the process for detecting height and starts a process for calculating the degree of parallelism.

The CPU 31 of the controller 30 calculates a difference ΔH between the height HA of the point A and the height HB of the point B.

$$\Delta H = HA - HB \quad \text{(Formula 1)}$$

Then, the CPU 31 of the controller 30 calculates the degree of parallelism as an absolute value of the difference ΔH.

$$\text{Degree of parallelism} = |\Delta HA - \Delta HB| \quad \text{(Formula 2)}$$

After the degree of parallelism is calculated, the CPU 31 of the controller 30 ends the process for calculating the degree of parallelism.

As described above, in the method for detecting the degree of parallelism of the embodiment, by using a simple method which detects the height H of the mounting head 20 when the tip end 42 of the triangular pin 41 contacts the holding surface 23 at multiple measurement positions on the placement surface 12, the actual degree of parallelism between the placement surface 12 of the stage 10 and the holding surface 23 of the mounting head 20 can be accurately detected.

In the above description, the case where the heights at two points, i.e., the points A and B, on the placement surface 12 with different coordinate positions in X direction are detected to detect the degree of parallelism between the placement surface 12 and the holding surface 23 is described. However, in the following, with reference to FIG. 4, the case where heights at four points, i.e., points A, B, C, and D, arranged in a lattice shape in X direction and Y direction are detected to detect the degree of parallelism between the placement surface 12 and the holding surface 23 that is a square surface. The XY coordinates of the point A is (x1, y1), the XY coordinates of the point B is (x2, y1), XY coordinates of the point C is (x1, y2), and the XY coordinates of the point D is (x2, y2). Like the description made with reference to FIGS. 2 and 3, the points A to D are respectively the measurement positions.

Firstly, as the description made with reference FIGS. 2 and 3, the triangular pin 41 is disposed so that the center of the triangular pin 41 as a measurement tool is located at the point A on the placement surface 12 of the stage 10. Then, the CPU 31 of the controller 30 lowers the mounting head 20 by using the movement mechanism 24, and, after the holding surface 23 of the mounting tool 22 abuts against the tip end 42 of the triangular pin 41, the controller 30 obtains the height of the mounting tool 22 that is detected by the encoder 25 as the height HA of the point A.

Once the height HA is obtained, the CPU 31 of the controller 30 raises the mounting head 20, and then arranges the mounting head 20 to wait at the raised position. In addition, the triangular pin 41 is moved in X direction, so that the center position of the triangular pin 41 is located at the position of the point B in the placement surface 12. Then, like the case of the point A, the CPU 31 of the controller 30 lowers the mounting head 20 by using the movement mechanism 24, and, after the holding surface 23 of the mounting tool 22 abuts against the tip end 42 of the triangular pin 41, the controller 30 obtains the height of the mounting tool 22 that is detected by the encoder 25 as the height HB of the point B.

In the following, similarly, the center position of the triangular pin 41 is moved to the point C, the point D, the mounting head 20 is lowered, and after the holding surface 23 of the mounting tool 22 abuts against the tip end 42 of the triangular pin 41, the heights of the mounting tool 22 detected by the encoder 25 are obtained as heights HC, HD at the point C and the point D (process for obtaining height).

Then, the CPU 31 of the controller 30 executes a process for calculating the degree of parallelism. The CPU 31 calculates a first set X difference and a second set X difference as in the following. The first set X difference is a difference between the heights HA and HB at the points A and B arranged at a pair of positions of the first set arranged in X direction, and is calculated by using Formula 3. Also, the second set X difference is a difference between the heights HC and HD at the points C and D arranged at a pair of positions of the second set arranged in X direction, and is calculated by using Formula 4.

$$\text{First set } X \text{ difference} = HA - HB \qquad \text{(Formula 3)}$$

$$\text{Second set } X \text{ difference} = HC - HD \qquad \text{(Formula 4)}$$

Then, the CPU 31 of the controller 30 calculates an X difference, which is an average between the first set X difference and the second set X difference, by using Formula 5.

$$X \text{ difference} = \qquad \text{(Formula 5)}$$
$$(\text{first set } X \text{ difference} + \text{second set } X \text{ difference})/$$
$$2 = [(HA - HB) + (HC - HD)]/2$$

Then, the CPU 31 of the controller 30 calculates an X direction degree of parallelism as an absolute value of the X difference by using Formula 6.

$$X \text{ direction degree of parallelism} = |X \text{ difference}| \qquad \text{(Formula 6)}$$

The same applies to Y direction. A third set Y difference that is a difference in height between the point A and the point C arranged at a pair of positions of the third set arranged in Y direction, a fourth set Y difference that is a difference in height between the point B and the point D arranged at a pair of positions of the fourth set arranged in Y direction, a Y difference as an average between the third set Y difference and the fourth set Y difference, and a Y direction degree of parallelism as an absolute value of the Y difference are calculated by using Formula 7 to Formula 10 in the following.

$$\text{Third set } Y \text{ difference} = HA - HC \qquad \text{(Formula 7)}$$

$$\text{Fourth set } Y \text{ difference} = HB - HD \qquad \text{(Formula 8)}$$

$$Y \text{ difference} = \qquad \text{(Formula 9)}$$
$$(\text{third set } Y \text{ difference} + \text{fourth set } Y \text{ difference})/$$
$$2 = [(HA - HC) + (HB - HD)]/2$$

$$Y \text{ direction degree of parallelism} = |Y \text{ difference}| \qquad \text{(Formula 10)}$$

Lastly, the CPU 31 of the controller 30 calculates a sum of the X direction degree of parallelism and the Y direction degree of parallelism in accordance with Formula 11 in the following as the degree of parallelism between the placement surface 12 and the holding surface 23.

$$\text{Degree of parallelism} = \qquad \text{(Formula 11)}$$
$$X \text{ direction degree of parallelism} + Y \text{ direction}$$
$$\text{degree of parallelism} = |X \text{ difference}| + |Y \text{ difference}|$$

As described above, in the case where the heights of the mounting tool 22 are detected at the four points, i.e., points A, B, C, and D, arranged in a lattice shape in X direction and Y direction are detected to detect the degree of parallelism between the placement surface 12 and the holding surface 23, since the degree of parallelism between the placement surface 12 of the stage 10 and the holding surface 23 of the mounting tool 22 can be detected by considering the X direction degree of parallelism and the Y direction degree of parallelism, the degree of parallelism can be detected accurately.

Figure 5:
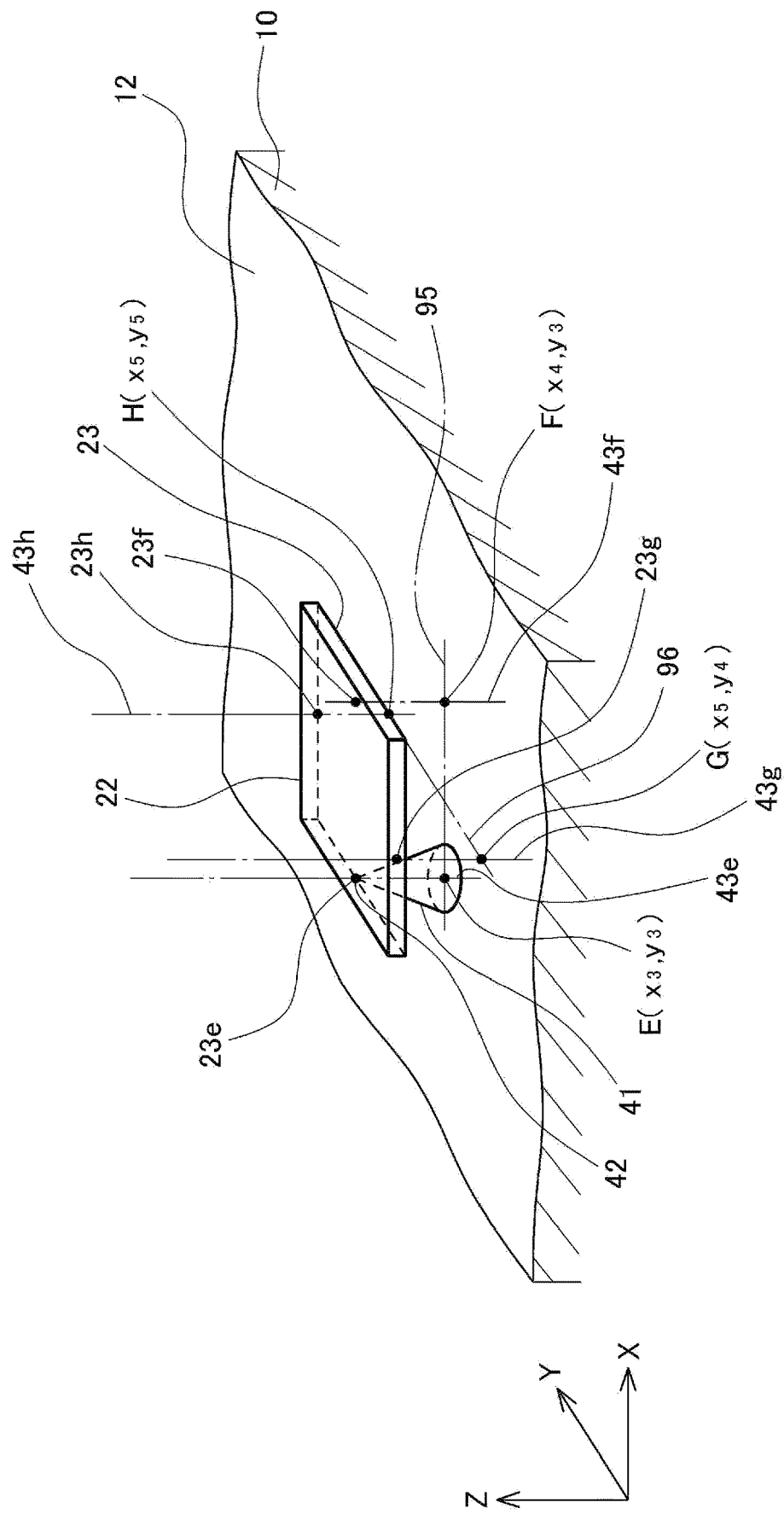
FIG. 5 is a view illustrating a process for detecting heights at four measurement positions arranged in a cross shape in X direction and Y direction at the time of detecting the degree of parallelism between the placement surface of the stage and the holding surface of the mounting head in the mounting device shown in FIG. 1.

In addition, as shown in FIG. 5, the four points may also be arranged in a cross shape in X direction and Y direction. The four points shown in FIG. 5 may include two points, i.e., points E and F, arranged on a line 95 extending in X direction and two points, i.e., points G and H, arranged on a line 96 extending in Y direction to be orthogonal to the line 95. In such case, the point E and the point F correspond to a pair of positions arranged in X direction, and the point G and the point H correspond to an other pair of positions arranged in Y direction. The coordinates of the point E is (x3, y3), the coordinates of the point F is (x4, y3), the coordinates of the point G is (x5, y4), and the coordinates of the point H is (x5, y5).

Figure 4:
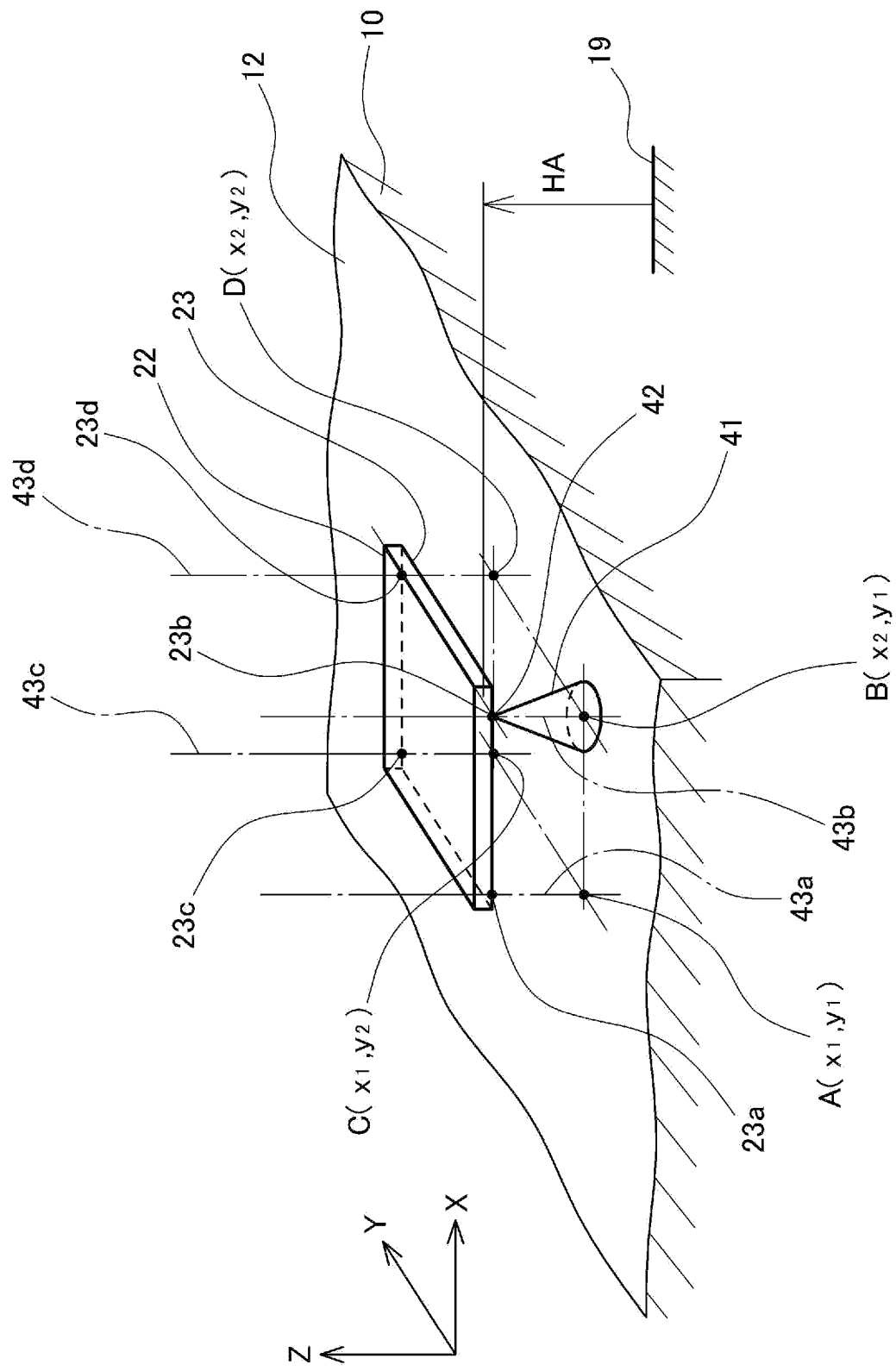
FIG. 4 is a view illustrating a process for detecting heights at four measurement positions arranged in a lattice shape at the time of detecting the degree of parallelism between the placement surface of the stage and the holding surface of the mounting head in the mounting device shown in FIG. 1.

In the following, similar to the description made with reference to FIG. 4, the center position of the triangular pin 41 is moved to the point E, the point F, the point G, and the point H, the mounting head 20 is lowered, and after the holding surface 23 of the mounting tool 22 contacts the tip end 42 of the triangular pin 41, the heights of the mounting tool 22 detected by the encoder 25 are obtained as heights HE, HF, HG, and HH at the point E, the point F, the point G, and the point H.

The CPU 31 of the controller 30 calculates the X direction degree of parallelism as the absolute value of the difference between the height HE of the point E and the height HF of the point F, calculates the Y direction degree of parallelism as the absolute value of the difference between the height HG of the point G and the height HH at the point H, and calculates the degree of parallelism between the placement surface 12 and the holding surface 23 as a sum of the X direction degree of parallelism and the Y direction degree of parallelism.

$$X \text{ direction degree of parallelism} = |HE - HF| \quad \text{(Formula 12)}$$

$$Y \text{ direction degree of parallelism} = |HG - HH| \quad \text{(Formula 13)}$$

$$\text{Degree of parallelism} = X \text{ direction degree of parallelism} + Y \text{ direction degree of parallelism} \quad \text{(Formula 14)}$$

With such method, the computing amount is smaller than that when the heights of the mounting tool 22 are detected at the four points, i.e., the points A to D, arranged in a lattice shape in X direction and Y direction, and the degree of parallelism between the placement surface 12 of the stage 10 and the holding surface 23 of the mounting tool 22 can be detected by considering the X direction degree of parallelism and the Y direction degree of parallelism.

Figure 6:
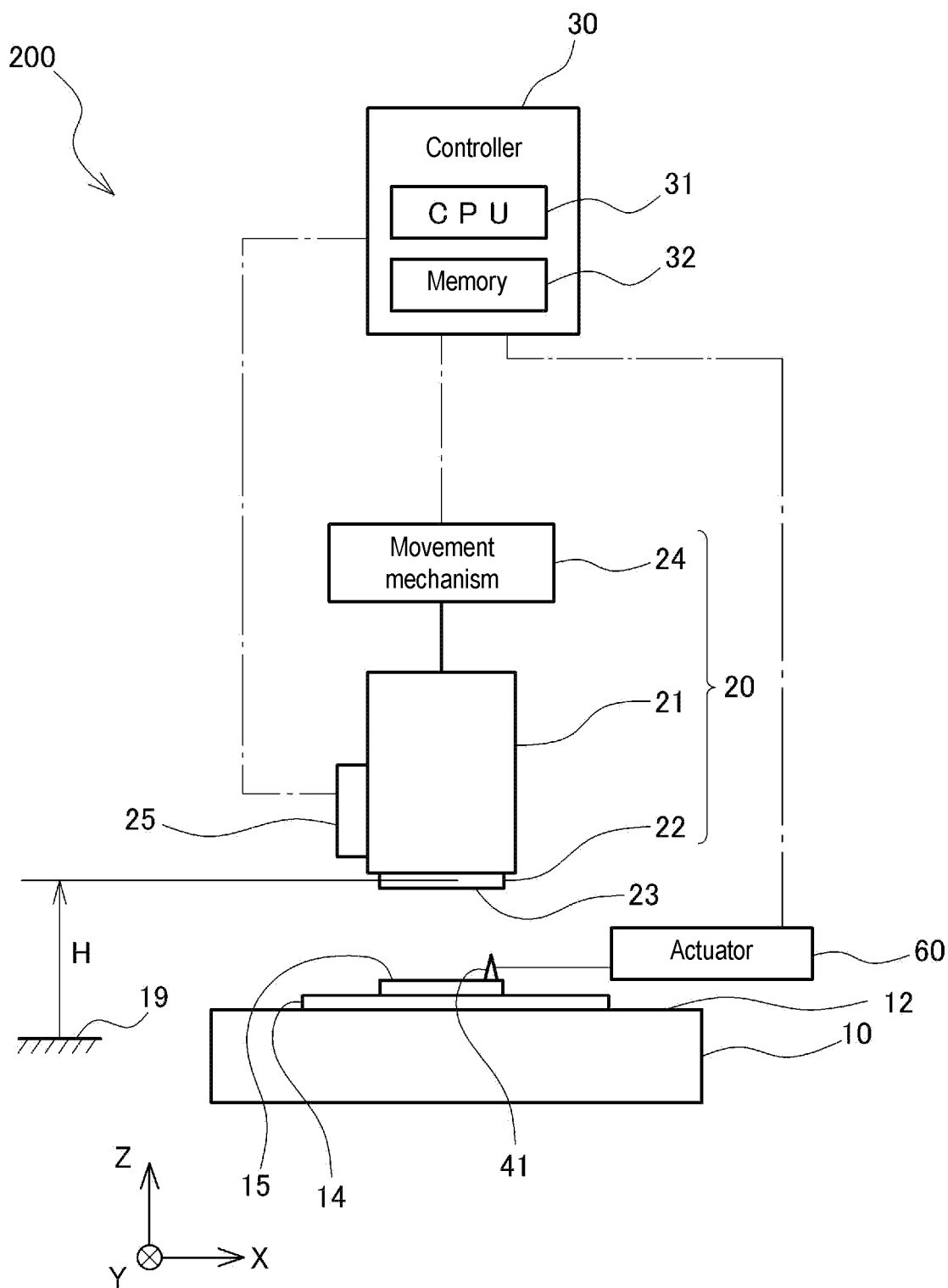
FIG. 6 is a view illustrating a configuration of a mounting device according to an embodiment.

In the following, a mounting device 200 according to an embodiment is described with reference to FIG. 6. Firstly, components same as those of the mounting device 100 described with reference to FIG. 1 are labeled with the same reference symbols, and the descriptions thereof are omitted.

The mounting device 200 includes an actuator 60 that moves the triangular pin 41 disposed on the placement surface 12 in the mounting device 100 described above. The actuator 60 is connected to the controller 30, operates in accordance with a command of the CPU 31 of the controller 30, and moves the position of the triangular pin 41.

Except that the CPU 31 of the controller 30 moves the position of the triangular pin 41 to the point A to the point H, the operation of detecting the degree of parallelism carried out by the mounting device 200 is the same as the operation of the mounting device 100 described above.

Since the mounting device 200 can automatically carry out the detection of degree of parallelism, the degree of parallelism can be conveniently carried out.

Although the above describes that the triangular pin 41 is moved by using the actuator 60, the invention is not limited thereto. For example, a triangular pin assembly 45 as shown in FIG. 7 may also be used. The triangular pin assembly 45 fixes the bottom surface of the triangular pin 41 onto a base 44. The base 44 extends toward a direction away from the triangular pin 41, and is able to suck and hold an upper surface 44a on the holding surface 23 without interfering with the mounting tool 22. In the state in which the upper surface 44a of the base 44 is sucked and held on the holding surface 23 of the mounting tool 22, the mounting head 20 is moved to a predetermined position as indicated by an arrow 99, and when the vacuum suction of the mounting tool 22 stops, the triangular pin 45 can be set at the predetermined position on the placement surface 12.

REFERENCE SIGNS LIST

10: Stage; 12: Placement surface; 14: Substrate; 15: Semiconductor chip; 19: Reference surface; 20: Mounting head; 21: Main body; 22: Mounting tool; 23: Holding surface; 24: Movement mechanism; 25: Encoder; 30: Controller; 31: CPU; 32: Memory; 41: Triangular pin; 42: Tip end; 44: Base; 44a: Upper surface; 45: Triangular pin assembly; 50: Positioning member; 60: Actuator; 100, 200: Mounting device.

What is claimed is:

1. A method for detecting a degree of parallelism of a mounting device mounting a semiconductor chip to a mounted body, the method comprising:
   a preparation step of preparing the mounting device, the mounting device comprising: a stage, comprising a placement surface on which the mounted body is placed; a mounting head, sucking and holding the semiconductor chip by using a holding surface facing the placement surface of the stage, and moving in Z direction that moves toward or away from the placement surface of the stage; and an encoder, detecting a height of the mounting head;
   a height detection step of, at a plurality of measurement positions, repetitively executing an operation of disposing a measurement tool of a predetermined height at one of the measurement positions on the placement surface of the stage, lowering the mounting head and detecting a height of the mounting head by using the encoder at a time when the holding surface contacts an upper end of the measurement tool and then moving the measurement tool to another one of the measurement positions on the placement surface, and at the measurement positions, detecting a plurality of heights of the mounting head at the time when the holding surface contacts the upper end of the measurement tool;
   a degree of parallelism calculation step of calculating a degree of parallelism between the placement surface of the stage and the holding surface of the mounting head based on the heights that are detected.

2. The method as claimed in claim 1, wherein the measurement positions are within a range facing the holding surface within the placement surface, and in the degree of parallelism calculation step, a difference of the heights at the measurement positions is calculated, and an absolute value of the difference is calculated as the degree of parallelism.

3. The method as claimed in claim 2, wherein the measurement positions are located at four positions arranged in a lattice shape in X direction and Y direction, and in the degree of parallelism calculation step, a first set X difference between a pair of heights at a pair of positions of a first set arranged in X direction and a second set X difference between a pair of heights at a pair of positions of a second set arranged in X direction are calculated, an average between the first set X difference and the second set X difference is calculated as an X difference, an absolute value of the X difference is calculated as an X direction degree of parallelism, a third set Y difference between a pair of heights at a pair of positions of a third set arranged in Y direction and a fourth set Y difference between a pair of heights at a pair of positions of a fourth set arranged in Y direction are calculated, an average between the third set Y difference and the fourth set Y difference is calculated as a Y difference, an absolute value of the Y difference is calculated as a Y direction degree of parallelism, the degree of parallelism is calculated as a sum of the X direction degree of parallelism and the Y direction degree of parallelism.

4. The method as claimed in claim 3, wherein the holding surface is a square surface, the measurement positions correspond to four corners of the holding surface.

5. The method as claimed in claim 2, wherein the measurement positions comprise a pair of positions arranged in X direction and another pair of positions arranged in Y direction, and in the degree of parallelism calculation step, an X direction degree of parallelism is calculated as an absolute value of a difference between a pair of heights at the pair of positions arranged in X direction, a Y direction degree of parallelism is calculated as an absolute value of a difference between another pair of heights at the another pair of positions arranged in Y direction, and the degree of parallelism is calculated as a sum of the X direction degree of parallelism and the Y direction degree of parallelism.

6. A mounting device, mounting a semiconductor chip to a mounted body, the mounting device comprising:

a stage, comprising a placement surface on which the mounted body is placed;

a mounting head, sucking and holding the semiconductor chip by using a holding surface facing the placement surface of the stage, and moving in Z direction that moves toward or away from the placement surface of the stage; and an encoder, detecting a height of the mounting head;

a measurement tool, having a predetermined height and disposed on the placement surface of the stage;

an actuator, moving the measurement tool within the placement surface; and a controller, adjusting movement of the mounting head and movement of the measurement tool, and calculating a degree of parallelism between the placement surface of the stage and the holding surface of the mounting head based on a height of the mounting head detected by using the encoder, wherein the controller is configured to:

at a plurality of measurement positions, repetitively execute an operation of disposing the measurement tool at one of the measurement positions on the placement surface of the stage by using the actuator, lower the mounting head and detect a height of the mounting head by using the encoder at a time when the holding surface contacts an upper end of the measurement tool and then moving the measurement tool to another one of the measurement positions on the placement surface by using the actuator, and at the measurement positions, detect a plurality of heights of the mounting head at the time when the holding surface contacts the upper end of the measurement tool, and calculate the degree of parallelism between the placement surface of the stage and the holding surface of the mounting head based on the heights that are detected.

7. The mounting device as claimed in claim 6, wherein the measurement positions are within a range facing the holding surface within the placement surface, and the controller is configured to:

calculate a difference of the heights at the measurement positions, and calculate an absolute value of the difference as the degree of parallelism.

* * * * *